(12) United States Patent
Stanek et al.

(10) Patent No.: US 9,637,024 B2
(45) Date of Patent: May 2, 2017

(54) CONTROLLING AN ELECTRIFIED VEHICLE IN RESPONSE TO DIFFERENCES IN ENERGY CONSUMPTION RATES

(71) Applicant: FORD GLOBAL TECHNOLOGIES, LLC, Dearborn, MI (US)

(72) Inventors: Joseph F. Stanek, Northville, MI (US); Jason Meyer, Canton, MI (US); John A. Lockwood, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 353 days.

(21) Appl. No.: 14/479,589

(22) Filed: Sep. 8, 2014

(65) Prior Publication Data

US 2016/0068080 A1     Mar. 10, 2016

(51) Int. Cl.
| | |
|---|---|
| *B60L 15/20* | (2006.01) |
| *G01R 21/00* | (2006.01) |
| *B60L 3/12* | (2006.01) |
| *B60L 11/14* | (2006.01) |
| *B60L 11/18* | (2006.01) |
| *B60W 10/08* | (2006.01) |

(52) U.S. Cl.
CPC ............ *B60L 15/2045* (2013.01); *B60L 3/12* (2013.01); *B60L 11/14* (2013.01); *B60L 11/1861* (2013.01); *B60W 10/08* (2013.01); *G01R 21/00* (2013.01); *B60L 2250/16* (2013.01); *B60L 2260/52* (2013.01); *B60L 2260/54* (2013.01); *Y02T 10/645* (2013.01); *Y02T 10/70* (2013.01); *Y02T 10/7005* (2013.01); *Y02T 10/705* (2013.01); *Y02T 10/7044* (2013.01); *Y02T 10/7077* (2013.01); *Y02T 10/72* (2013.01); *Y02T 10/7283* (2013.01); *Y10S 903/903* (2013.01)

(58) Field of Classification Search
CPC B60W 20/00; B60L 15/20; B60L 3/12; B60L 11/14; G01R 21/00
USPC .............................. 701/22, 123; 180/65.265
See application file for complete search history.

(56) References Cited

U.S. PATENT DOCUMENTS

| | | | |
|---|---|---|---|
| 8,121,802 B2 | 2/2012 | Grider et al. | |
| 8,666,576 B2 | 3/2014 | Kim | |
| 9,346,452 B2 | 5/2016 | Qiu et al. | |
| 2013/0073113 A1 | 3/2013 | Wang et al. | |
| 2013/0158758 A1 | 6/2013 | Kim | |
| 2013/0166125 A1* | 6/2013 | Yamamoto | B60L 7/14 701/22 |
| 2013/0311016 A1 | 11/2013 | Kim | |
| 2014/0142836 A1* | 5/2014 | Yabuta | B60W 10/06 701/123 |
| 2014/0222259 A1 | 8/2014 | Yoshimoto et al. | |
| 2015/0170426 A1* | 6/2015 | You | B60L 1/003 701/123 |

* cited by examiner

*Primary Examiner* — Tan Q Nguyen
(74) *Attorney, Agent, or Firm* — Carlson, Gaskey & Olds, P.C.

(57) ABSTRACT

An exemplary method of controlling an electrified vehicle includes adjusting operation of an electrified vehicle in response to a difference between a first energy consumption rate and a second energy consumption rate. The first energy consumption rate is based on energy consumption over a first duration. The second energy consumption rate is based on energy consumption over a second duration.

20 Claims, 5 Drawing Sheets

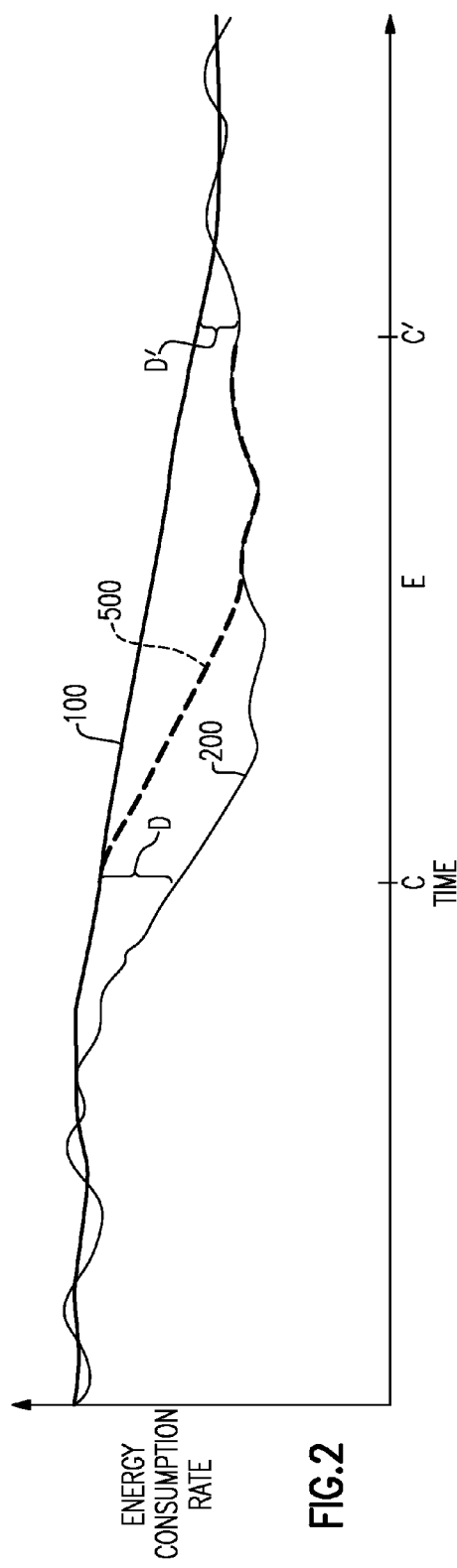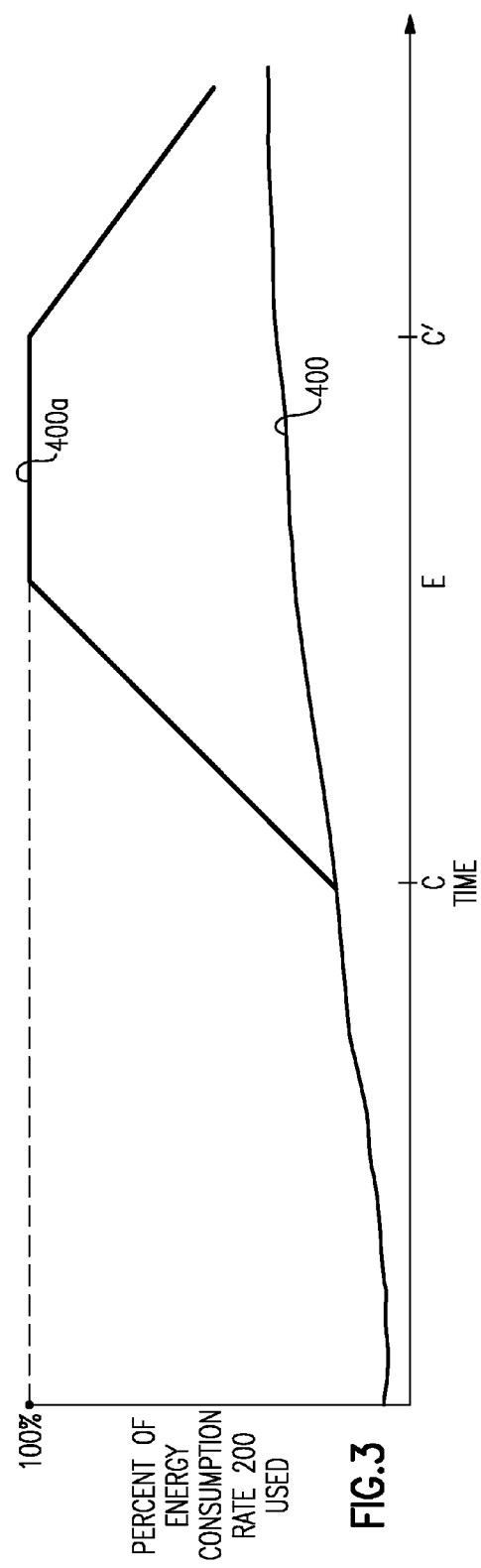

CONTROLLING AN ELECTRIFIED VEHICLE IN RESPONSE TO DIFFERENCES IN ENERGY CONSUMPTION RATES

TECHNICAL FIELD

This disclosure is directed toward controlling electrified vehicles and, more particularly, to adjusting operation of an electrified vehicle in response to energy consumption rate differences.

BACKGROUND

Generally, electrified vehicles differ from conventional motor vehicles because electrified vehicles are selectively driven using one or more battery-powered electric machines. Conventional motor vehicles, by contrast, rely exclusively on an internal combustion engine to drive the vehicle. Electrified vehicles may use electric machines instead of, or in addition to, the internal combustion engine.

Example electrified vehicles include hybrid electrified vehicles (HEVs), plug-in hybrid electrified vehicles (PHEVs), fuel cell vehicles, and battery electrified vehicles (BEVs). A powertrain of an electrified vehicle is typically equipped with a battery pack having battery cells that store electrical power for powering the electric machine. The battery cells may be charged prior to use. The battery cells may be recharged during a drive by regeneration braking or an internal combustion engine.

Predicting energy consumption for the electrified vehicle is useful to, for example, estimate a distance-to-empty for the electrified vehicle. Some vehicles predict energy consumption based on energy consumption rates over different durations.

SUMMARY

A method of controlling an electrified vehicle according to an exemplary aspect of the present disclosure includes, among other things, adjusting operation of an electrified vehicle in response to a difference between a first energy consumption rate and a second energy consumption rate. The first energy consumption rate is based on energy consumption over a first duration. The second energy consumption rate is based on energy consumption over a second duration.

In a further non-limiting embodiment of the foregoing method, the first duration is a long-term duration relative to the second duration.

In a further non-limiting embodiment of any of the foregoing methods, the first duration is a first range of past driving and the second duration is a second range of past driving that is less than the first range.

In a further non-limiting embodiment of any of the foregoing methods, the adjusting is in response to the difference and a continuation of the difference for a set duration of time.

In a further non-limiting embodiment of any of the foregoing methods, the adjusting comprises adjusting a predicted distance-to-empty for the electrified vehicle in response to the difference.

In a further non-limiting embodiment of any of the foregoing methods, the adjusting comprises changing a blend of a distance-to-empty based on the first energy consumption rate and a distance-to-empty based on the second energy consumption rate.

In a further non-limiting embodiment of any of the foregoing methods, the adjusting is in response to the difference and geographical information.

In a further non-limiting embodiment of any of the foregoing methods, the adjusting is in response to the difference and a climate condition.

In a further non-limiting embodiment of any of the foregoing methods, the adjusting comprises changing a driving route for the electrified vehicle.

In a further non-limiting embodiment of any of the foregoing methods, the adjusting comprises substituting the first energy consumption rate with the second energy consumption rate in a distance-to-empty calculation.

In a further non-limiting embodiment of any of the foregoing methods, the first duration is a long-term duration relative to the second duration.

An electrified vehicle according to an exemplary aspect of the present disclosure includes, among other things, a data storage module to hold energy consumption data of an electrified vehicle and a controller that adjusts operation of the electrified vehicle in response to a difference between a first and a second energy consumption rate. The first energy consumption rate is based on energy consumption over a first duration. The second energy consumption rate is based on energy consumption over a second duration.

In a further non-limiting embodiment of the foregoing electrified vehicle, the first duration is a long-term duration relative to the second duration.

In a further non-limiting embodiment of the any of foregoing electrified vehicles, the first duration is a first time period of past driving and the second duration is a second time period of past driving that is less than the first time period.

In a further non-limiting embodiment of any of the foregoing electrified vehicles, the controller adjusts operation in response to the difference and a continuation of the difference for a set duration of time.

In a further non-limiting embodiment of any of the foregoing electrified vehicles, the controller adjusts a predicted distance-to-empty for the electrified vehicle based on the difference.

In a further non-limiting embodiment of any of the foregoing electrified vehicles, the controller adjusts a blend of a distance-to-empty based on the first energy consumption rate and a distance-to-empty based on the second energy consumption rate.

In a further non-limiting embodiment of any of the foregoing electrified vehicles, the controller adjusts by substituting the first energy consumption rate with the second energy consumption rate in a distance-to-empty calculation.

In a further non-limiting embodiment of any of the foregoing electrified vehicles, the first duration is a long-term duration relative to the second duration.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

DESCRIPTION OF THE FIGURES

The various features and advantages of the disclosed examples will become apparent to those skilled in the art from the detailed description. The figures that accompany the detailed description can be briefly described as follows:

FIG. 2 graphically illustrates moving averages of energy consumption rates over different durations for the electrified vehicle having the powertrain of FIG. 1.

FIG. 3 graphically shows curves of the percentage of an energy consumption rates for different blend schedules.

DETAILED DESCRIPTION

During operation, an electrified vehicle can consume energy. Many variables influence energy consumption. Example variables include, but are not limited to, how the vehicle is accelerated, how the vehicle is stopped, road grades, road conditions, driving environments, and vehicle accessories consuming energy.

An energy consumption rate for the electrified vehicle can be expressed as energy consumption per kilometer, for example. An average energy consumption rate for the electrified vehicle can change depending on the duration used when calculating the average energy consumption rate. That is, an average energy consumption rate over the past ten minutes of driving can differ from an average energy consumption rate over the past three hours of driving. Further, an average energy consumption rate based on the past twenty kilometers of driving can differ from an average energy consumption rate based on the past two hundred kilometers of driving.

The electrified vehicle can use energy consumption rates for various purposes. For example, a predicted rate of energy consumption can be based on an average energy consumption rate for the electrified vehicle. Since the predicted rate of energy consumption is used to, for example, estimate a distance-to-empty for the electrified vehicle, the average energy consumption rate influences distance-to-empty estimates.

This disclosure is directed toward adjusting operation of the electrified vehicle in response to differences between energy consumption rates over different durations. The adjusting can include using an adjusted energy consumption rate when estimating a distance-to-empty for the electrified vehicle.

Figure 1:
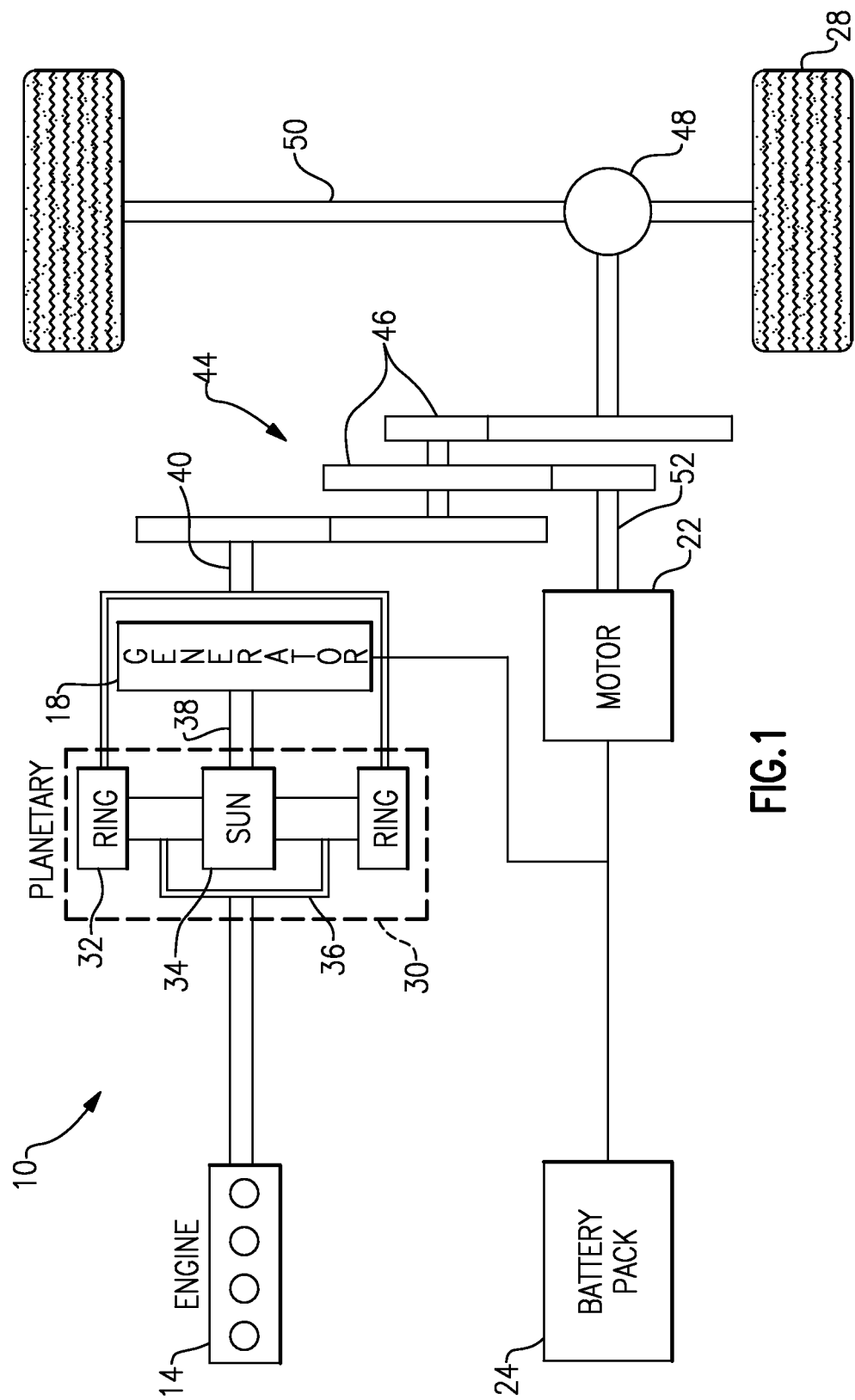
FIG. 1 schematically illustrates an example powertrain for an electrified vehicle.

FIG. 1 schematically illustrates a powertrain 10 for an electrified vehicle. Although depicted as used within a plug-in hybrid electrified vehicle (PHEV), it should be understood that the concepts described herein are not limited to PHEVs and could extend to other electrified vehicles, including, but not limited to, battery electrified vehicles (BEVs) and fuel cell vehicles.

In one embodiment, the powertrain 10 is a powersplit powertrain system that employs a first drive system and a second drive system. The first drive system includes a combination of an engine 14 and a generator 18 (i.e., a first electric machine). The second drive system includes at least a motor 22 (i.e., a second electric machine), the generator 18, and a battery pack 24. In this example, the second drive system is considered an electric drive system of the powertrain 10. The first and second drive systems generate torque to drive one or more sets of vehicle drive wheels 28 of the electrified vehicle.

The engine 14, which is an internal combustion engine in this example, and the generator 18 may be connected through a power transfer unit 30, such as a planetary gear set. Of course, other types of power transfer units, including other gear sets and transmissions, may be used to connect the engine 14 to the generator 18. In one non-limiting embodiment, the power transfer unit 30 is a planetary gear set that includes a ring gear 32, a sun gear 34, and a carrier assembly 36.

The generator 18 can be driven by engine 14 through the power transfer unit 30 to convert kinetic energy to electrical energy. The generator 18 can alternatively function as a motor to convert electrical energy into kinetic energy, thereby outputting torque to a shaft 38 connected to the power transfer unit 30.

The ring gear 32 of the power transfer unit 30 is connected to a shaft 40, which is connected to vehicle drive wheels 28 through a second power transfer unit 44. The second power transfer unit 44 may include a gear set having a plurality of gears 46. Other power transfer units can also be used.

The gears 46 transfer torque from the engine 14 to a differential 48 to ultimately provide traction to the vehicle drive wheels 28. The differential 48 may include a plurality of gears that enable the transfer of torque to the vehicle drive wheels 28. In this example, the second power transfer unit 44 is mechanically coupled to an axle 50 through the differential 48 to distribute torque to the vehicle drive wheels 28.

The motor 22 (i.e., the second electric machine) can also be employed to drive the vehicle drive wheels 28 by outputting torque to a shaft 52 that is also connected to the second power transfer unit 44.

The battery pack 24 is an example type of electrified vehicle battery assembly. The battery pack 24 may have the form of a high voltage battery that is capable of outputting electrical power to operate the motor 22 and the generator 18. Other types of energy storage devices and/or output devices can also be used with the electrified vehicle having the powertrain 10.

Operators of the electrified vehicle rely on distance-to-empty (DTE) estimates to, among other things, estimate whether they can drive the electrified vehicle to a desired location without a recharge, or without relying on the first drive system. Average energy consumption for the electrified vehicle can be used when estimating a distance-to-empty (DTE) for the electrified vehicle. In general, DTE is a calculation of available energy (within the battery pack 24) divided by the predicted energy consumption rate. The predicted energy consumption rate is often based on average rates of energy consumption.

Referring to FIG. 2, an average energy consumption rate 100 for the electrified vehicle is based on a first duration of past drives, and an average energy consumption rate 200 for the electrified vehicle is based on a second duration of past drives. The durations can be distances, time periods spent driving, etc. Although described as average rates, the rates 100 and 200 could be rates calculated based on something other than a true average rate over the durations. For example, the rates could be weighted based on the operating conditions, or could be another derived value.

In this example, the first duration is a relatively long-term duration, such as the past one-hundred kilometers of driving or past three hours of driving. The second duration is a relatively short-term duration, such as the past twenty kilometers of driving or past thirty minutes of driving. The rates 100 and 200 can change over time as the electrified vehicle is driven.

As can be appreciated, using different energy consumption rates can influence calculations, such as DTE, that rely on energy consumption rates. To minimize these discrepancies and enhance the fidelity of calculations using energy consumption rates, many electrified vehicles blend energy consumption rates from different durations, or blend calculations that are based on the energy consumption rates from different driving durations.

Figure 4:
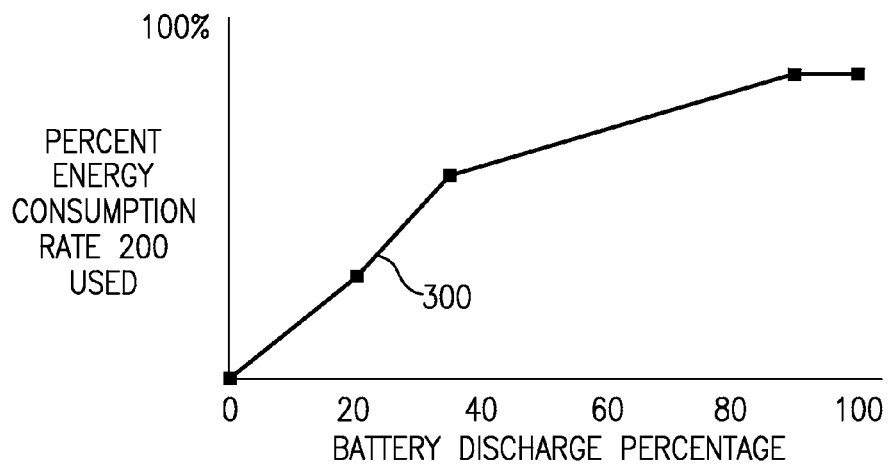
FIG. 4 graphically illustrates a fixed blend schedule for use when calculating a distance-to-empty for the electrified vehicle having the powertrain of FIG. 1.

Referring to FIGS. 3 and 4 with continuing reference to FIG. 2, the rates 100 and 200 of an example embodiment are, by default, blended according to a set blend schedule 300. In the set blend schedule 300, the percent and influence of the rate 200 used in the calculations increases as the battery discharge percentage increases. Thus, as charge in the battery pack 24 decreases, the electrified vehicle relies more heavily on the energy consumption rate 200, which is based on relatively short-term duration.

When the rates 100 and 200 are relatively close to each other, such as before time C in FIG. 2, calculations having the rates 100 and 200 blended according to the set blend schedule 300 are reliable. When the rates 100 and 200 move further from each other, such as from time C to time C', adjustments from the set blend schedule 300 can improve the reliability of calculations requiring an energy consumption rate.

In this example, the electrified vehicle adjusts from the set blend schedule 300 in response to a difference between the rates 100 and 200 at or above a difference D. When the difference between the rates 100 and 200 at a given time is below the difference D, such as before time, the electrified vehicle blends the rates 100 and 200 according to the set blend schedule 300. When the difference exceeds the difference D, the operation of the electrified vehicle is adjusted by calculating DTE based one of the rates 100 or 200, or based on a blend other than the blend specified in the set blend schedule 300.

In response to the difference meeting or exceeding the difference D, the electrified vehicle may, for example, calculate a DTE according to an adjusted blend schedule rather than the set blend schedule 300. The adjusted blend schedule can specify, for example, that one of the rates, likely the energy consumption rate 200, should be used in place of the energy consumption rate 100, and that the blend should gradually move to this position. The adjusted blend schedule in another example, may specify that the energy consumption rate 200 is weighted at ninety percent. The example adjusted blend schedule is not a function of charge, but could be in other examples.

Notably, the difference may need to last for a set duration of time, say five minutes, before triggering the change in how the DTE is calculated. The set duration can be calibrated and, in some examples, adjusted.

A curve 400 demonstrates a blend of the energy consumption rate 100 with the energy consumption rate 200. The blend is based on the set blend schedule 300.

Curve 400a, by contrast, demonstrates another blend of the energy consumption rate 100 with the energy consumption rate 200. The blend of the curve 400a is based on an adjusted blend schedule, which is triggered in response to the observed difference between 100 and 200 exceeding the difference D.

The difference between the rate 100 and the rate 200 is continually tracked. If the difference drops below the difference D', the blending value of curve 1100 begins to return to the nominal case curve 1000 as the adjusted blend schedule moves back to the set blend schedule 300.

Figure 5:
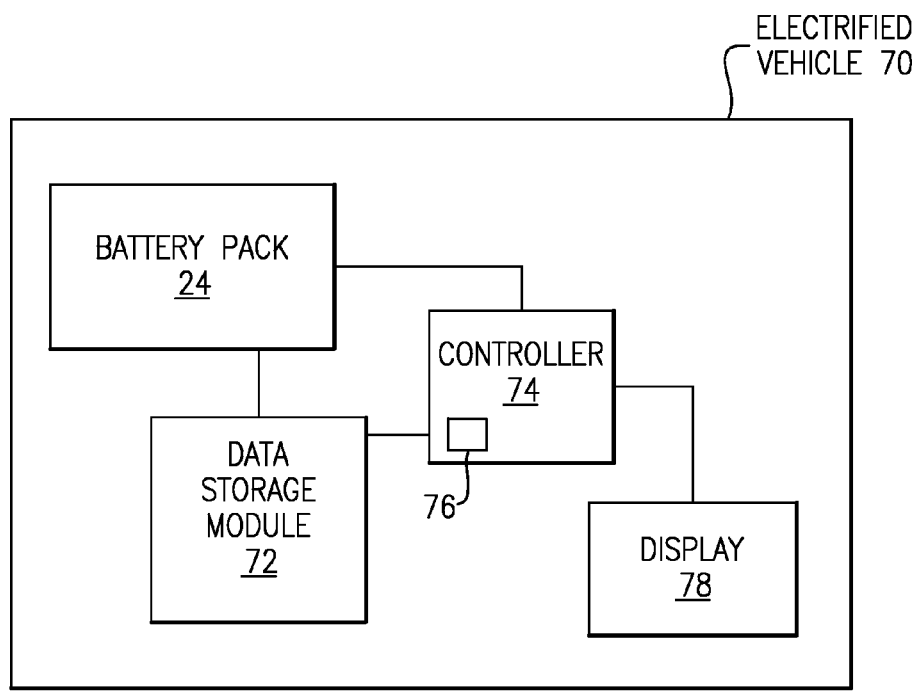
FIG. 5 illustrates a highly schematic view of the electrified vehicle having the powertrain of FIG. 1.

Referring now to the schematic of FIG. 5 with reference to FIG. 1, an example electrified vehicle 70 having the powertrain 10 includes a data storage module 72 and a controller 74 operatively linked to each other and the battery pack 24. The data storage module 72 holds energy consumption data for drive cycles of the electrified vehicle 70, such as the rates 100 and 200 represented graphically in FIG. 2. The date storage module 72 and the controller 74 may be internal to the vehicle 70, external to the vehicle 70, or both.

The example controller 74 includes a processor 76 to execute a program that predicts energy consumption for the vehicle 70. The prediction may be used to provide the DTE for the vehicle 70, for example. How the predicted energy consumption is calculated can change based, at least in part, on variations in the rates 100 and 200.

The predicted energy consumption, DTE, or other information can be displayed on a display 78 for viewing by an occupant of the vehicle 70. The display 78 could be a visual display, an audible warning, or some combination of these. The display 78 could also be outside the vehicle 70.

Figure 6:
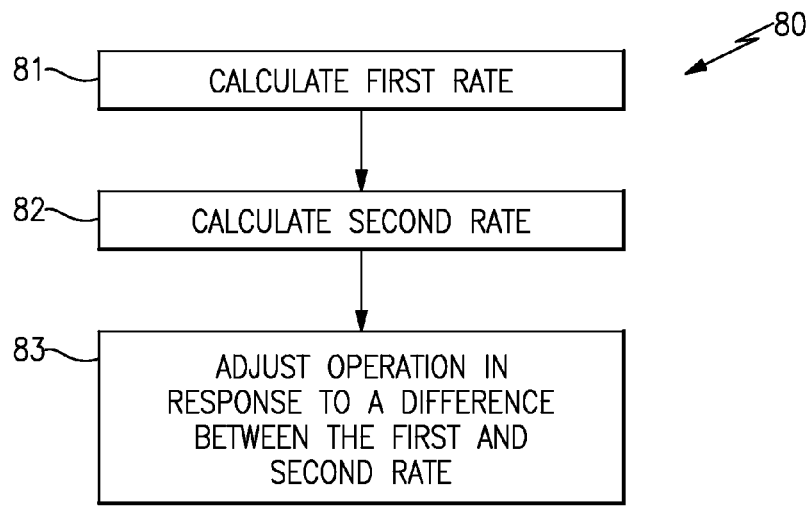
FIG. 6 schematically illustrates a flow of an example method of controlling the electrified vehicle of FIG. 5.

Referring to FIG. 6 with reference to FIGS. 2 to 4, the processor 76 is programmed to execute some or all of the steps in a method 80 of controlling the electrified vehicle 70. The example method 80 includes a step 81 of calculating the rate 100, which is an average rate based on the relatively long-term duration. The example method 80 includes a step 82 of calculating the second rate 200, which is an average rate based on the second, relatively short-term duration. The method 80 then, at a step 83, adjusts operation of the electrified vehicle 70 in response to a difference between the first and the second rates 100 and 200.

At the step 83, the method 80 may require a factor to trigger the adjusting in addition to the difference between the rates 100 and 200. For example, moving to the step 83 may additionally require that the change in the energy consumption rate be attributable to a known noise factor such as a change in ambient temperature, or a driving pattern change from city driving to highway driving.

In another example, moving to the step 83 may require the variation in the second rate calculated at the step 82 is less than a threshold value. If the variation is not less than the threshold value, the method 80 returns to the step 81.

If the variation is less than the threshold value, the method 80 moves to a step where the difference between the rates 100 and 200 is compared to a threshold value. If the difference between the rates 100 and 200 is greater than the threshold value, the method 80 makes the adjustments at the step 83. If not, the method returns to the step 81.

In some examples, moving to the step 83 can require that the ratio of the variation in the second energy consumption rate to the difference is less than a threshold value.

Adjusting operation of the electrified vehicle at the step 83 can include adjusting a blend of the rates 100 and 200 used to calculate DTE. The adjusting at the step 83 could also include replacing or substituting the rate 100 with the rate 200, or vice versa, when calculating the DTE. For example, if the difference D between the rates 100 and 200 increases to an exceedingly high value, the method treats one of the rates 100 or 200 as being more reliable and calculates the DTE using a higher weighting on that one of the rates 100 or 200. The replacement rate may be ramped in, (gradually introduced).

In adjusting at the step 83 could instead include, or additionally include, rerouting the electrified vehicle 70 to travel a different route. For example, if the DTE from the step 83 indicates that a desired destination cannot be reached without recharging the battery pack 24, the method 80 could alert the driver to suggest traveling a different route to reach a charging station before the desired destination.

Other potential adjustments could include providing a warning that the electrified vehicle 70 should being driven less aggressively, that a planned route can be extended, that certain systems (such as electrical systems) of the electrified vehicle 70 should be shut down to conserve energy, suggesting a change in driving style, etc.

Other potential adjustments could include maintaining the set blend schedule, but weighting newly acquired rate information more heavily (or less heavily).

Figure 7:
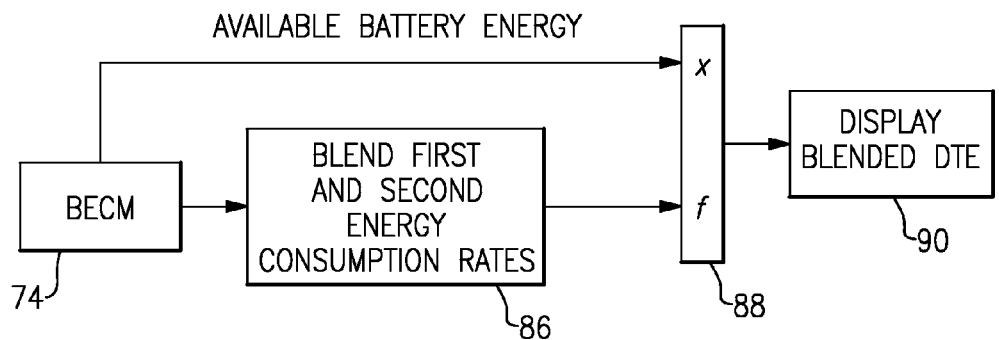
FIG. 7 schematically illustrates blending of energy consumption rates to calculate a distance-to-empty.

Referring now to the FIG. 7, and with reference to FIGS. 1 to 5, the controller 74 of the example electrified vehicle 70 is, in one example, a battery electronic control module (BECM) 74.

In this embodiment, the BECM 74 monitors a difference between the first rate 100 and the second rate 200 during operation of the electrified vehicle 70. The BECM 74 blends the rates 100 and 200 at block 86 to provide a blended rate to a DTE calculation block 88. Within the DTE calculation block 88, the available energy (from the battery pack 24) is divided by the blended rate from the block 86. The resulting DTE is displayed as a blended DTE at a block 90 on the display 78.

Notably, when the difference between the rates 100 and 200 is at or below the difference D, the BECM 74 blends the rates 100 and 200 in the block 86 according to the set blend schedule 300. However, when the difference between the rates 100 and 200 exceeds the difference D, the BECM blends the rates 100 and 200 according the adjusted blend schedule.

In this example, the difference D represents a significant difference between the rate 100 and the rate 200, say a difference of greater than fifty percent of the lower of the two rates 100 or 200. The difference can be calibrated and, in some examples, adjustable.

The rates 100 and 200 are thus blended according to the set blend schedule 300 prior to the time C and after the time C'. From the time C to the time C', the rates 100 and 200 are blended according to the adjusted blend schedule. As shown in FIG. 3, in the curve 400*a*, in the adjusted blend schedule, the weighting of the energy consumption rate 200 begins to increase towards a one hundred percent weighting. At time C', the difference between rates 100 and 200 drops below a threshold D' at which point the adjusted blend schedule begins to return to the normal blending weight specified by schedule 300. The blending of the rates 100 and 200 according to the adjusted blend schedule provides an adjusted blended rate 500 (FIG. 2) from the time C to the time C'.

In another example, when the difference between the rates 100 and 200 exceeds the difference D, the BECM 74 replaces the rate 100 with the rate 200 rather than blending the rates 100 and 200. The replacing of the rate 100 with the rate 200 takes the place of the blending the rates 100 and 200 according to the adjusted blend schedule. Replacing the rate 100 with the rate 200 can e necessary if, for example, the rate 100 is outside a specified range, which can indicate that the rate 100 is less reliable than the rate 200.

Figure 8:
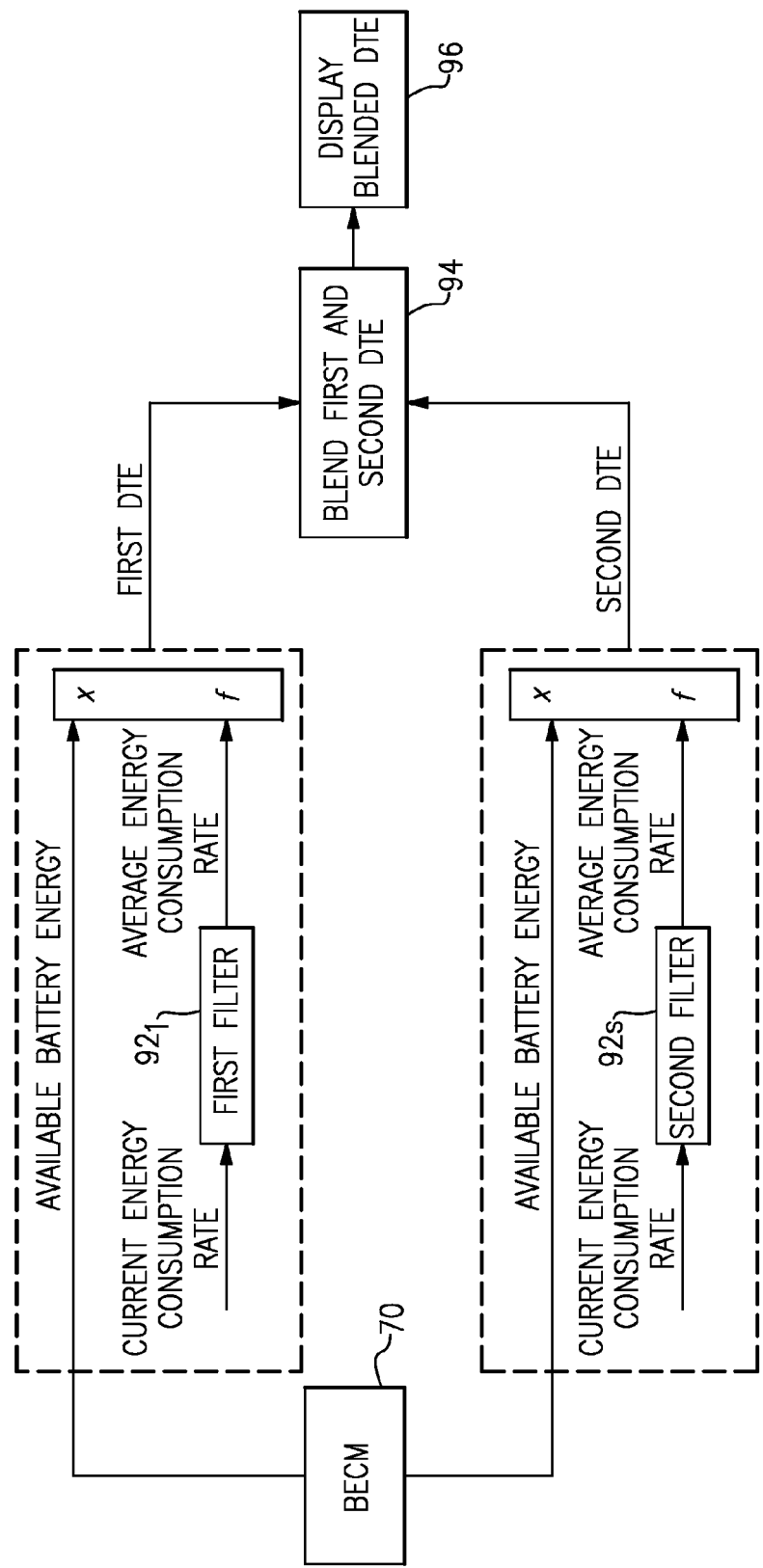
FIG. 8 schematically illustrates a blending to provide a blended distance-to-empty using a first distance-to-empty based on a first energy consumption rate and a second distance-to-empty based on a second energy consumption rate.

Referring now to FIG. 8 with reference to FIGS. 2 and 5, in another example, the BECM 74 calculates a first DTE based on the first rate 100 and calculates a second DTE based on the second rate 200. The first DTE is then blended with the second DTE to provide a blended DTE. The BECM 74 of the FIG. 8 example blends DTEs rather than rate of energy consumption.

More specifically, the BECM 74 includes a first filter $92_1$ associated with the first rate 100 and a second filter $92_s$ associate with the second rate 200. The first DTE is calculated using the first filter $92_1$ and the second DTE is calculated using the second filter $92_S$. At a DTE calculation box 94, the first DTE is blended with the second DTE to provide the blended DTE.

Since the first DTE is established based on the first rate 100, the first DTE is considered a long-term DTE. Since the second DTE is established based on the second rate 200, the second DTE is considered a short-term DTE.

The blend of the first DTE with the second DTE is typically according to a fixed DTE blend schedule. However, the BECM 74 adjusts from the fixed DTE blend schedule in response to a significant change between the rate 100 and the rate 200. The BECM 74 could instead, or in addition to, adjust from the fixed DTE blend schedule in response to a significant change between the first DTE and the second DTE.

The system may optionally consider the variation of the second energy consumption rate when deciding whether to deviate from the fixed blending schedule. If for example the ratio of the standard deviation of the second energy consumption rate to the difference between the first and second energy consumption rates is larger than 0.5 (50%), then the system may choose to continue to use the fixed blending schedule. Such use cases can indicate that the energy consumption rate is highly variable and the first rate is more reliable.

Conversely, the system might deviate from the fixed blending schedule if this ratio is smaller than 0.5 (50%). Such use cases can indicate a significant duration of lower (or higher), short-term energy consumption with a relatively small short term variance which indicates that the second rate is more reliable. A transition from extended driving on highways to extended city driving is one such example.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

We claim:

1. A method of controlling an electrified vehicle, comprising:
   adjusting operation of an electrified vehicle in response to a difference between a first energy consumption rate and a second energy consumption rate, the first energy consumption rate based on energy consumption over a first duration, the second energy consumption rate based on energy consumption over a second duration.

2. The method of claim 1, wherein the first duration is a long-term duration relative to the second duration, and the first duration includes the second duration.

3. The method of claim 1, wherein the first duration is a first range of past driving and the second duration is a second range of past driving that is both less than the first range and included within the first range.

4. The method of claim 1, wherein the adjusting is in response to the difference and a continuation of the difference for a set duration of time.

5. The method of claim 1, wherein the adjusting comprises adjusting a predicted distance-to-empty for the electrified vehicle in response to the difference.

6. The method of claim 1, wherein the adjusting comprises changing a blend of a distance-to-empty based on the first energy consumption rate and a distance-to-empty based on the second energy consumption rate.

7. The method of claim 1, wherein the adjusting is in response to the difference and geographical information.

8. The method of claim 1, wherein the adjusting is in response to the difference and a climate condition.

9. The method of claim 1 wherein the adjusting is in response to the difference and a variation in the second energy consumption rate.

10. The method of claim 1, wherein the adjusting comprises changing a driving route for the electrified vehicle.

11. The method of claim 1, wherein the adjusting comprises substituting the first energy consumption rate with the second energy consumption rate in a distance-to-empty calculation.

12. The method of claim 10, wherein the first duration is a long-term duration relative to the second duration, and the second duration is included within the first duration.

13. An electrified vehicle, comprising:
   a data storage module to hold energy consumption data of an electrified vehicle; and
   a controller that adjusts operation of the electrified vehicle in response to a difference between a first and a second energy consumption rate, the first energy consumption rate based on energy consumption over a first duration, the second energy consumption rate based on energy consumption over a second duration.

14. The electrified vehicle of claim 13, wherein the first duration is a long-term duration relative to the second duration, and the first duration includes the second duration.

15. The electrified vehicle of claim 13, wherein the first duration is a first time period of past driving and the second duration is a second time period of past driving that is both less than the first time period and forms a portion of the first time period of past driving.

16. The electrified vehicle of claim 13, wherein the controller adjusts operation in response to the difference and a continuation of the difference for a set duration of time.

17. The electrified vehicle of claim 13, wherein the controller adjusts a predicted distance-to-empty for the electrified vehicle based on the difference.

18. The electrified vehicle of claim 13, wherein the controller adjusts a blend of a distance-to-empty based on the first energy consumption rate and a distance-to-empty based on the second energy consumption rate.

19. The electrified vehicle of claim 13, wherein the controller adjusts by substituting the first energy consumption rate with the second energy consumption rate in a distance-to-empty calculation.

20. The electrified vehicle of claim 19, wherein the first duration is a long-term duration relative to the second duration, and the second duration is included within the first duration.

* * * * *